United States Patent [19]
Palmer

[11] Patent Number: 5,434,546
[45] Date of Patent: Jul. 18, 1995

[54] CIRCUIT FOR SIMULTANEOUS AMPLITUDE MODULATION OF A NUMBER OF SIGNALS

[76] Inventor: James K. Palmer, 134 Fel Mar Dr., San Luis Obispo, Calif. 93405

[21] Appl. No.: 151,736

[22] Filed: Nov. 15, 1993

[51] Int. Cl.⁶ .................... H03C 1/00; H03C 1/54
[52] U.S. Cl. .................... 332/151; 332/149; 332/152; 332/168; 332/178; 455/59; 455/108; 455/326
[58] Field of Search ............... 332/151, 152, 153, 154, 332/172, 178, 167, 168, 169, 170, 149; 455/59, 103, 108, 323, 326, 327, 328, 333

[56] References Cited

U.S. PATENT DOCUMENTS

| | | | |
|---|---|---|---|
| 2,835,889 | 5/1958 | Dyer et al. | 332/151 X |
| 3,260,964 | 7/1966 | Whitehead et al. | 455/103 X |
| 3,304,515 | 2/1967 | Stieler | 331/78 |
| 3,586,993 | 6/1971 | Buck | 331/78 |
| 3,651,429 | 3/1972 | Ruthroff | 332/145 X |
| 3,939,419 | 2/1976 | Lindner | 331/78 X |
| 4,039,968 | 8/1977 | Emshwiller | 331/19 |
| 4,176,319 | 11/1979 | Kahn | 332/151 X |
| 4,481,490 | 11/1984 | Huntley | 332/152 |

*Primary Examiner*—David Mis
*Attorney, Agent, or Firm*—Daniel C. McKown

[57] ABSTRACT

A method for simultaneously imposing a single modulating signal on a number of constant frequency carriers includes applying the single modulating signal and all of the carriers to a doubly-balanced mixer circuit that produces sideband signals that are uncontaminated by the carriers. The sideband signals thus produced are then combined with signals proportional to the carriers in a linear circuit to obtain an output signal equivalent to a signal that would result from combining separately modulated carriers.

3 Claims, 2 Drawing Sheets

CIRCUIT FOR SIMULTANEOUS AMPLITUDE MODULATION OF A NUMBER OF SIGNALS

BACKGROUND OF THE INVENTION

1. Field of the Invention

The present invention is in the field of radio and more specifically is concerned with a circuit to produce simultaneous amplitude modulation of any number of carrier signals without causing intermodulation distortion or spurious signals that would adversely affect the quality of the modulated signals.

Such a circuit can be useful where it is desired to transmit an emergency message in an area such as a tunnel or a remote canyon where AM broadcast band reception may be blocked. Typically, vehicle radios entering such an area may be tuned to any of several known carrier frequencies.

In some locations, provision has been made for re-transmitting a number of AM channels into the area where normal broadcast reception is blocked, by use of a local transmitter.

Since the vehicle radios are already pre-tuned to several known carrier frequencies, it becomes necessary to apply the emergency audio signal simultaneously to each of the carriers used in re-transmitting the AM channels.

2. The Prior Art

The conventional prior art approach to the problem of applying the emergency audio signal simultaneously to each of the carriers would be to combine the carriers $C_1, C_2, C_3, \ldots$ and then to modulate the combination, so that the broadcast signal B can be represented as $$B = M(C_1 + C_2 + C_3 + \ldots)$$

where M is the modulating signal.

This conventional multiplicative approach leaves much to be desired. A plethora of unwanted signals are produced which cause interference and unintelligible reception in the broadcast receivers. This unfortunate result occurs because nonlinearities in the conventional AM modulator cause intermodulation distortion resulting in the generation of signals that are the sum and difference of any signal combinations within the circuit.

So far as I can determine, the problem of applying a single modulating signal to a number of carrier signals simultaneously has not been satisfactorily solved.

SUMMARY OF THE INVENTION

The object of the present invention is to permit simultaneous modulation of any number of carrier frequencies by a single modulating signal without producing the undesirable intermodulation distortion and other unwanted signals.

In contrast to the multiplicative approach of the prior art, the present invention uses an additive approach in which the broadcast signal B can be represented as $$B = C_1 + S_{1U} + S_{1L} + C_2 + S_{2U} + S_{2L} + C_3 + S_{3U} + S_{3L} + \ldots$$

where $S_{1U}$ is the upper sideband of carrier $C_1$ and $S_{1L}$ is the lower sideband of carrier $C_1$, etc.

This additive approach of the present invention has been found to eliminate the intermodulation distortion and spurious signals which plagued the conventional prior art approach.

The present invention provides the answer to the question of how the sidebands $S_{1U}, S_{1L}, S_{2U}, S_{2L}$, etc. are obtained for use in the preceding equation.

In accordance with a preferred embodiment of this invention, the modulating signal is applied to unbalance a doubly-balanced mixer circuit which produces as an output the upper and lower sidebands which are then combined with each of the known carrier frequencies before being rebroadcast. The circuit for reinsertion of the carriers consists of linear components only.

The novel features which are believed to be characteristic of the invention, both as to organization and method of operation, together with further objects and advantages thereof, will be better understood from the following description considered in connection with the accompanying drawings in which a preferred embodiment of the invention is illustrated by way of example. The drawings are for the purpose of illustration and description only and are not intended as a definition of the limits of the invention.

BRIEF DESCRIPTION OF THE DRAWINGS

FIG. 1, including

DETAILED DESCRIPTION OF THE PREFERRED EMBODIMENT

Figure 1A:
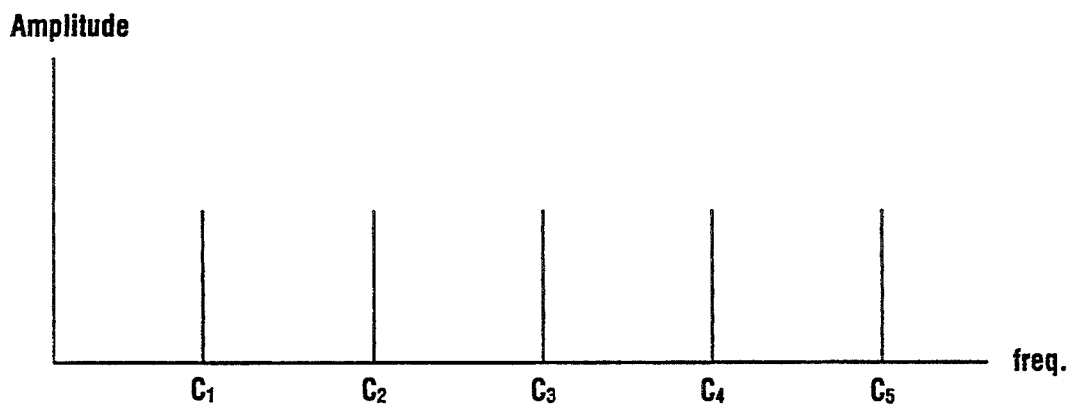
FIGS. 1a, 1b, and 1c, are graphs showing the spectra of signal components in the present invention.
Figure 1B:
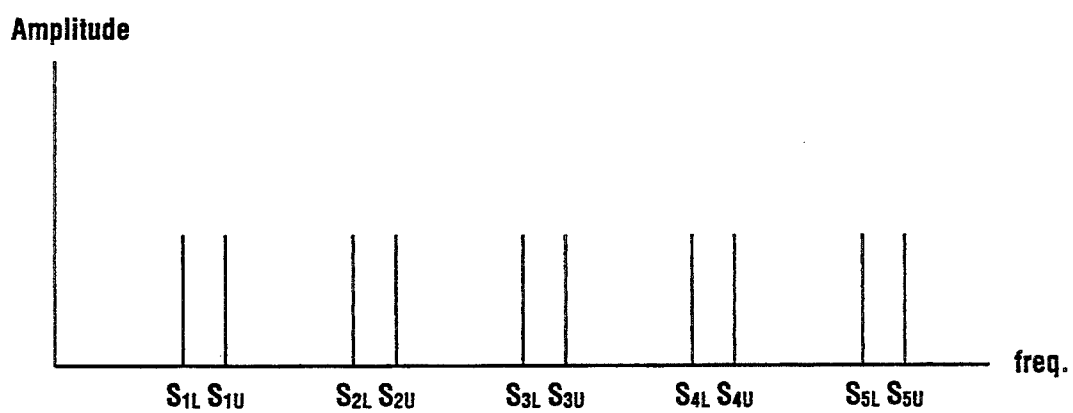
Figure 1C:
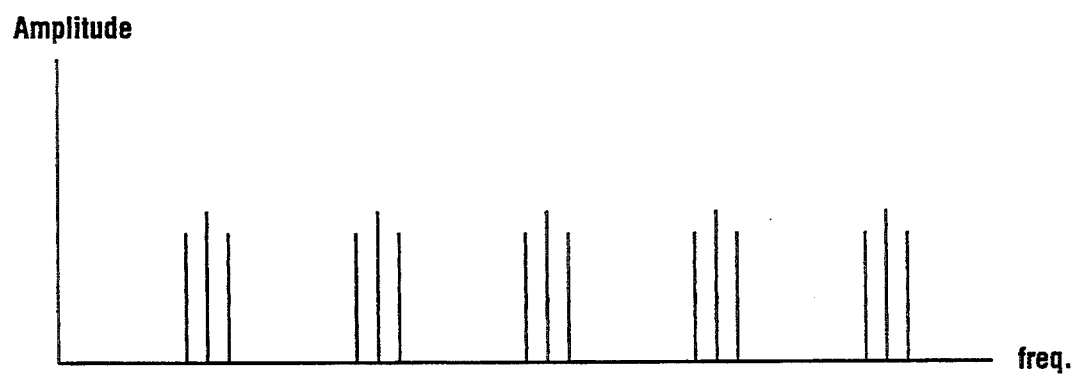

It will be recalled that the instantaneous voltage e of an AM modulated carrier can be expressed in the form $$e = E_C \cos W_C t + \tfrac{1}{2} M_A E_C \cos (W_C + W_M) t + \tfrac{1}{2} M_A E_C \cos (W_C - W_M) t$$

where
$E_c$ = peak voltage of the carrier
$W_c = 2\pi$ (carrier frequency)
$W_m = 2\pi$ (modulation frequency)
$M_A$ = amplitude of modulation signal
t = time From this equation it is clear that the amplitude modulated signal is the addition of three voltages which are: the carrier, the upper sideband, and the lower sideband. It can also be seen that the sidebands are equal in magnitude, and are separated in frequency from the frequency of the carrier by the same number of cycles per second. FIG. 1a shows a number of carrier frequencies which are to be modulated, FIG. 1b shows the upper and lower sidebands, and FIG. 1c shows the spectrum for the several amplitude modulated carriers.

Figure 2:
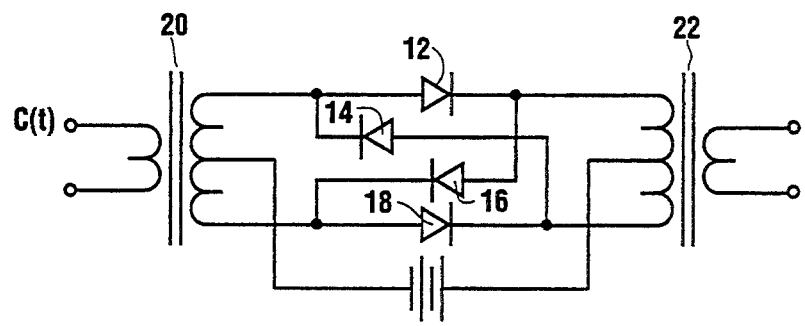
FIG. 2 is a schematic electronic diagram showing a doubly-balanced mixer of a type known in the prior art.

The present invention makes use of a well-known circuit, the doubly-balanced mixer shown in FIG. 2. This circuit uses four matched diodes 12, 14, 16, 18 connected in a full bridge configuration. The input and output of the bridge circuit are coupled to centertapped transformers 20 and 22 that have equal output voltages on either sides of their center taps.

When the diodes of the bridge are balanced, and the input and output transformers are well matched, and when the carrier signal C(t) is coupled to the primary of transformer 20, and adjusted to a voltage level of approximately 3 volts peak, measured from the center tap to one side of the transformer secondary, then the diode array will conduct on alternate polarities of the carrier, providing signals in transformer 22 of equal and opposite polarities, thereby canceling the output of transformer 22. When the circuit is thus balanced, no output will occur.

If a D.C. voltage greater than 1 volt is coupled between the two transformer center taps, two of the diodes will be biased causing the bridge to become unbalanced and causing an output signal to appear on the output of transformer 22.

Figure 3:
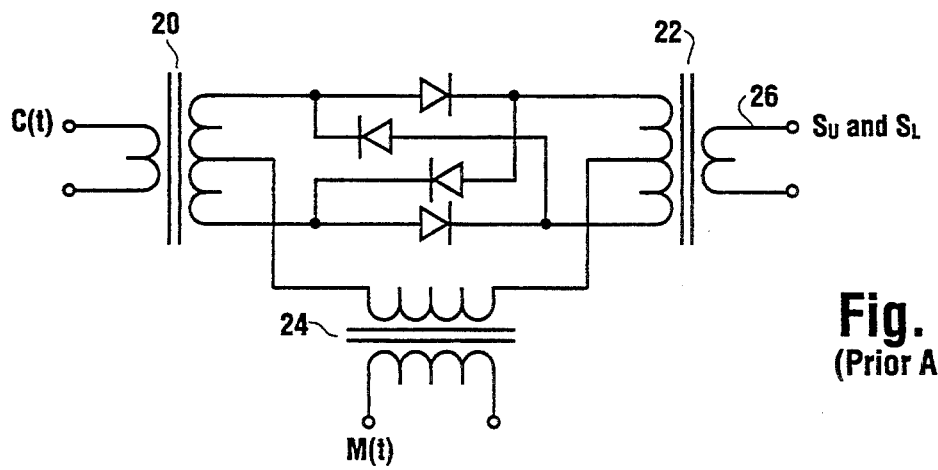
FIG. 3 is a schematic circuit diagram showing the doubly-balanced mixer of FIG. 1 used with a modulation transformer as known in the prior art; and, FIG. 4 is a schematic circuit diagram showing the circuit of the present invention in a preferred embodiment.

If, instead of a fixed biased voltage as used in FIG. 2, a modulating signal M(t) is coupled to the transformer center taps by use of a third transformer 24, the output of transformer 22 will be switched on and off in compliance with the modulating signal; i.e., at the frequency of the modulating signal. When the polarity of the modulating signal matches that of the carrier, the resultant signal is the upper sideband, and when the polarity of the modulating signal is opposite to that of the carrier, the resulting signal is the lower sideband. The upper and lower sideband signals take turns being present on the same conductor 26, at the carrier frequency, which is very much greater than the frequency of the modulating signal. Since no carrier frequency signal passes through the mixer circuit of FIG. 3, the resulting signals are substantially free of intermodulation.

In this connection, the choice of diodes for this circuit is important. The use of matched quad Schotky diodes such as those produced by Hewlett Packard Company, results in the rejection of the carrier in excess of 50 db. These diodes result in an almost undetectable level of distortion and yield broadcast quality modulation for any number of carriers.

The doubly-balanced mixer circuit described thus far is well-known in the art where it has been used for the generation of single sideband signals.

Figure 4:
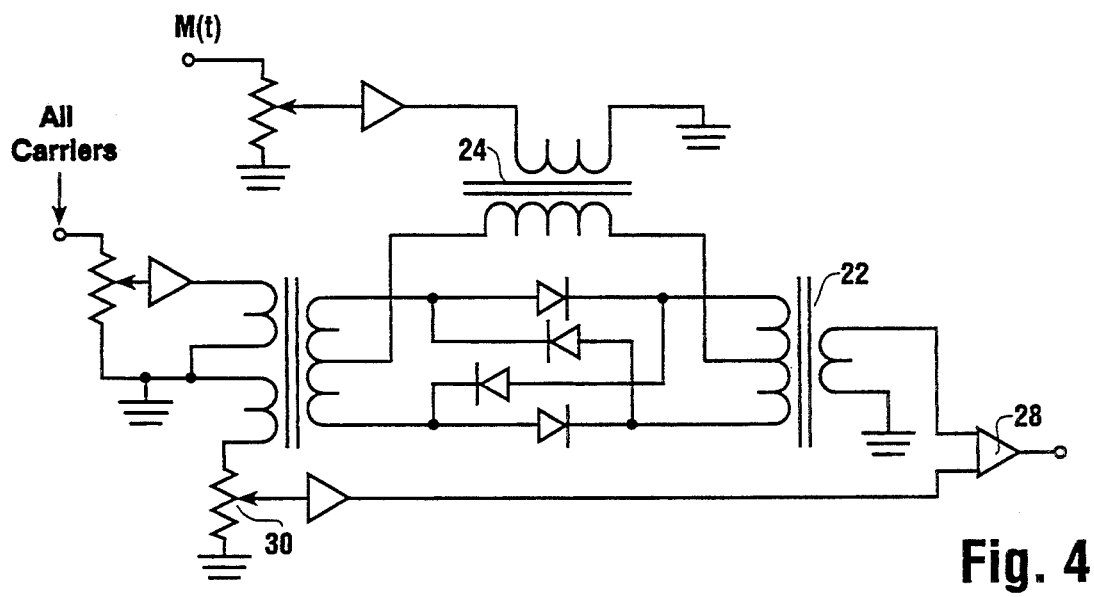

The present inventor discovered how to insert one or more carriers into the output with the amplitude of the double sidebands set precisely at the level corresponding to 100 percent modulation. The circuit in FIG. 4 shows a preferred embodiment of the present invention. Because the carrier in amplitude modulation is not affected in frequency or phase by the modulation, it is reinserted between the sidebands at a point beyond the modulator, thereby eliminating the problem of intermodulation from the nonlinear portion of the diodes. The reinsertion circuit consists of linear components only, so the modulator results in the simultaneous modulation of multiple carriers without distortion.

In the circuit of FIG. 4 the reinsertion circuit consists of a linear amplifier 28. The potentiometer 30 permits the amplitude of the carrier signal to be adjusted initially by a human operator to a level, relative to the amplitude of the sidebands, corresponding to 100 percent modulation.

The foregoing detailed description is illustrative of one embodiment of the invention, and it is to be understood that additional embodiments thereof will be obvious to those skilled in the art. The embodiments described herein together with those additional embodiments are considered to be within the scope of the invention.

What is claimed is:

1. A method for simultaneously imposing a single modulating signal on a number of constant frequency carriers, comprising the steps of:
    a) applying the single modulating signal and all of the carriers to a circuit that produces sidebands corresponding to all of the carriers but which does not pass any of the carriers;
    b) combining in a linear circuit the sidebands thus produced with signals proportional to the carriers to obtain a combined signal equivalent to a signal that would result from modulating separately each of the carriers by the single modulating signal and then combining the modulated carriers.

2. The method of claim 1 wherein said circuit is a doubly-balanced mixer circuit.

3. The method of claim 1 wherein said linear circuit is a linear amplifier.

* * * * *